United States Patent
Kim et al.

(10) Patent No.: US 10,072,352 B2
(45) Date of Patent: Sep. 11, 2018

(54) SILICON SINGLE CRYSTAL GROWING APPARATUS AND SILOCON SINGLE CRYSTAL GROWING METHOD USING SAME

(71) Applicant: SK SILTRON CO., LTD., Gumi-si, Gyeongsangbuk-do (KR)

(72) Inventors: Do Yeon Kim, Gyeongsangbuk-do (KR); Il Soo Choi, Gyeongsangbuk-do (KR); Yun Ha An, Gyeongsangbuk-do (KR)

(73) Assignee: SK SILTRON CO., LTD., Gumi-si, Gyeongsanbuk-Do (KR)

( * ) Notice: Subject to any disclaimer, the term of this patent is extended or adjusted under 35 U.S.C. 154(b) by 0 days.

(21) Appl. No.: 15/327,260

(22) PCT Filed: Jul. 10, 2015

(86) PCT No.: PCT/KR2015/007169
§ 371 (c)(1),
(2) Date: Jan. 18, 2017

(87) PCT Pub. No.: WO2016/021843
PCT Pub. Date: Feb. 11, 2016

(65) Prior Publication Data
US 2017/0167048 A1  Jun. 15, 2017

(30) Foreign Application Priority Data

Aug. 5, 2014 (KR) .......................... 10-2014-0100301
Jan. 7, 2015 (KR) .......................... 10-2015-0001950

(51) Int. Cl.
*C30B 15/04* (2006.01)
*C30B 15/20* (2006.01)
(Continued)

(52) U.S. Cl.
CPC ............ *C30B 15/203* (2013.01); *C30B 15/00* (2013.01); *C30B 15/02* (2013.01); *C30B 15/04* (2013.01); *C30B 15/14* (2013.01); *C30B 29/06* (2013.01)

(58) Field of Classification Search
CPC .......... C30B 15/00; C30B 15/02; C30B 15/04
See application file for complete search history.

(56) References Cited

U.S. PATENT DOCUMENTS 5,450,814 A * 9/1995 Shiraishi ................. C30B 15/14
117/202
5,759,261 A * 6/1998 Dornberger ............. C30B 15/14
117/217

(Continued)

FOREIGN PATENT DOCUMENTS

JP          06-092784        4/1994
JP          2007-290961      11/2007

(Continued)

OTHER PUBLICATIONS

International Search Report dated Oct. 16, 2015 issued in Application No. PCT/KR2015/007169.

(Continued)

*Primary Examiner* — Robert M Kunemund
(74) *Attorney, Agent, or Firm* — KED & Associates, LLP

(57) ABSTRACT

An exemplary embodiment of the present invention provides a silicon single crystal growing apparatus and method. The apparatus comprises: a chamber; a crucible that is disposed in the chamber and receives melted silicon; a heater disposed outside the crucible to heat the crucible; a heat shield part disposed in the chamber; and an auxiliary heat shield part disposed above the crucible to move upward and downward, wherein the auxiliary heat shield part is disposed to be separated from a body part of a single crystal that has grown from the melted silicon, and a rising speed is con- (Continued)

trolled such that a defect-free zone in the single crystal body part increases. The auxiliary heat shield part can reduce a deviation of a temperature gradient in the body part, whereby increasing the distribution of a defect-free zone in the body part.

10 Claims, 8 Drawing Sheets

(51) Int. Cl.
*C30B 15/00* (2006.01)
*C30B 15/02* (2006.01)
*C30B 15/14* (2006.01)
*C30B 29/06* (2006.01)

(56) References Cited

U.S. PATENT DOCUMENTS 5,900,059 A * 5/1999 Shimanuki .............. C30B 15/14
 117/217
5,935,326 A * 8/1999 Kotooka .................. C30B 15/14
 117/217
6,733,585 B2 * 5/2004 Inagaki .................... C30B 15/14
 117/13
6,858,076 B1 * 2/2005 Nakajima ............... C30B 15/14
 117/13

FOREIGN PATENT DOCUMENTS

| JP | 2009-179524 | 8/2009 |
| JP | 2012-091942 | 5/2012 |
| KR | 10-2001-0108424 | 12/2001 |
| KR | 10-2014-0013284 | 2/2014 |

OTHER PUBLICATIONS

Japanese Office Action dated Nov. 29, 2017 issued in Application No. 2017-504817.

* cited by examiner

[FIG. 1]
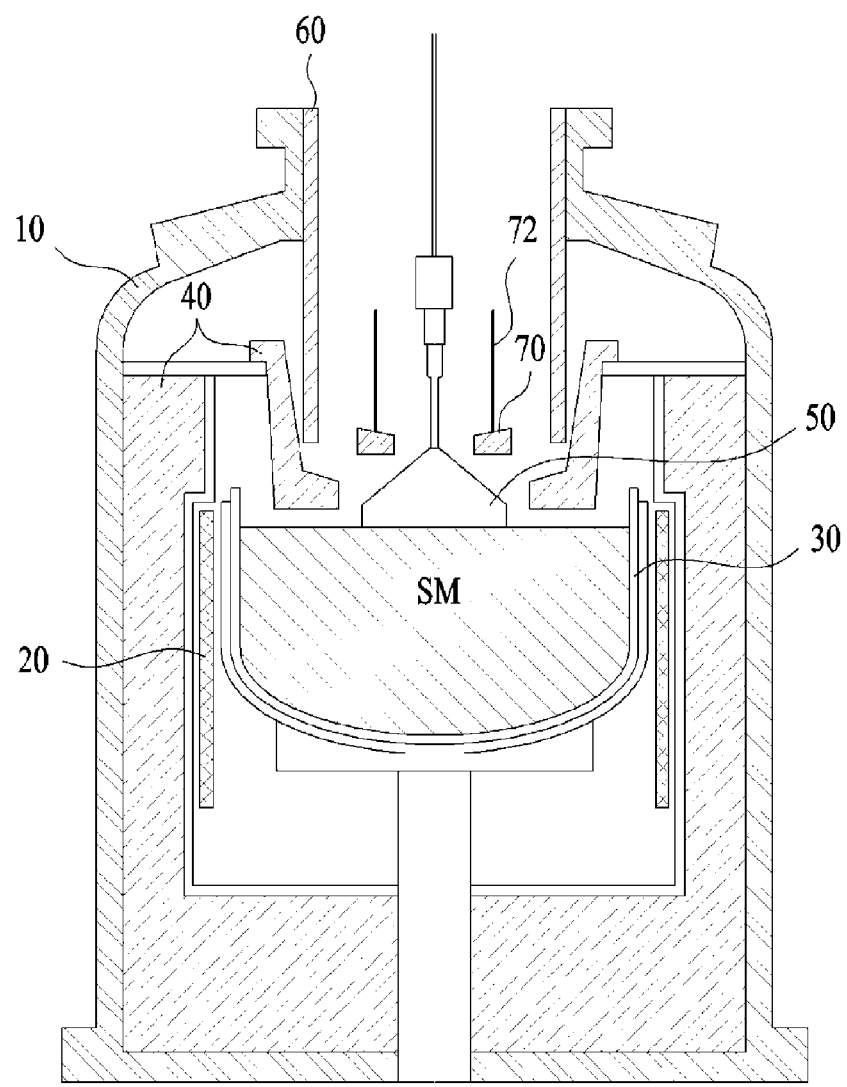

【FIG. 2a】
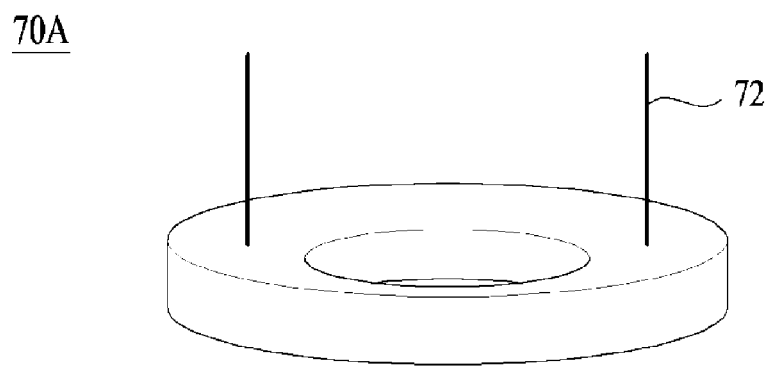
【FIG. 2b】
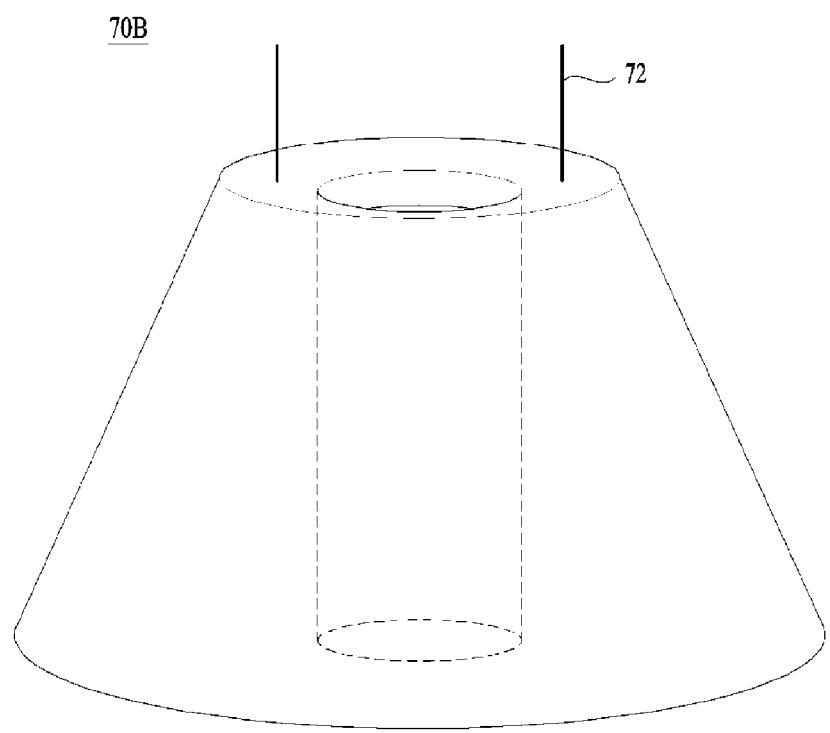

[FIG. 3]
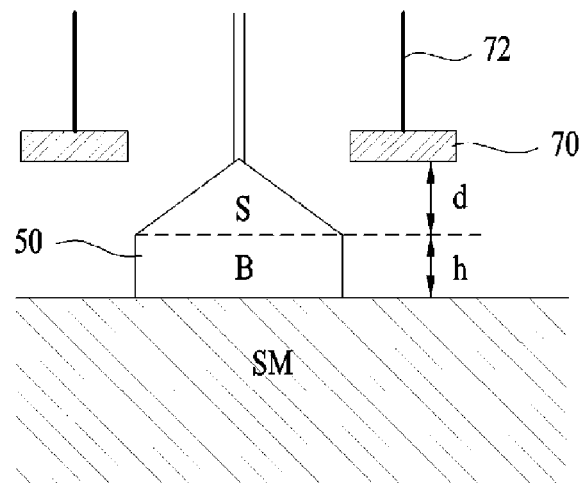
[FIG. 4a]
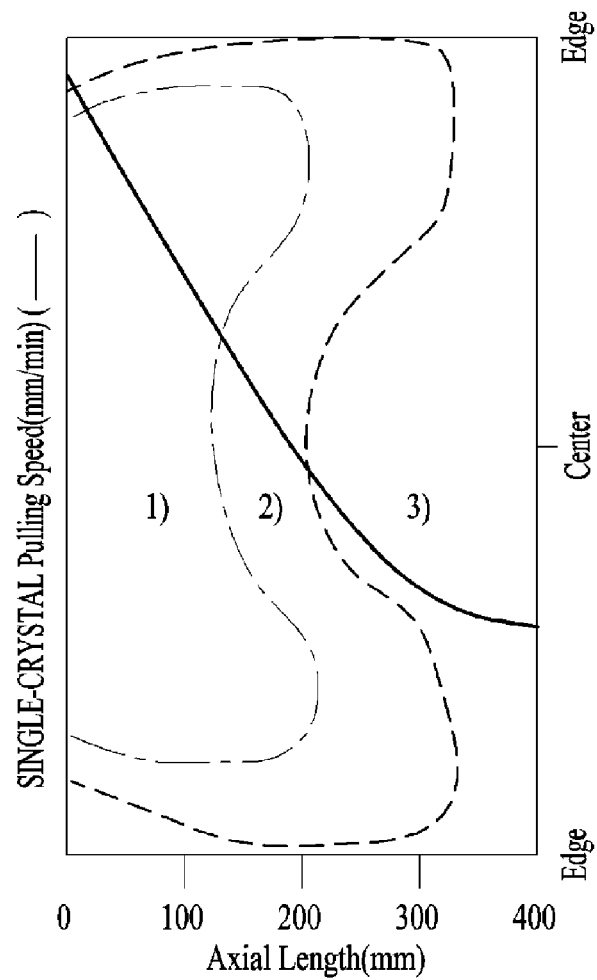

【FIG. 4b】
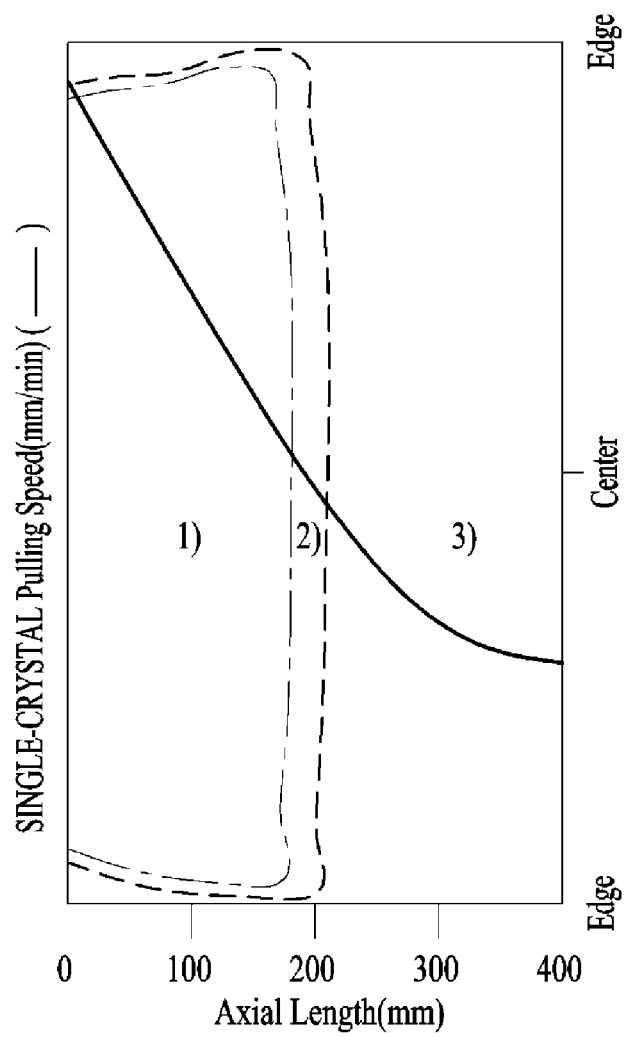

[FIG. 5]
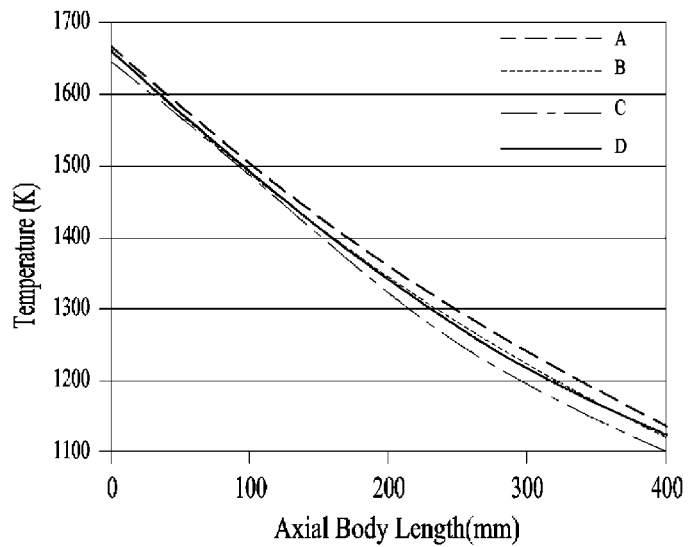
[FIG. 6]
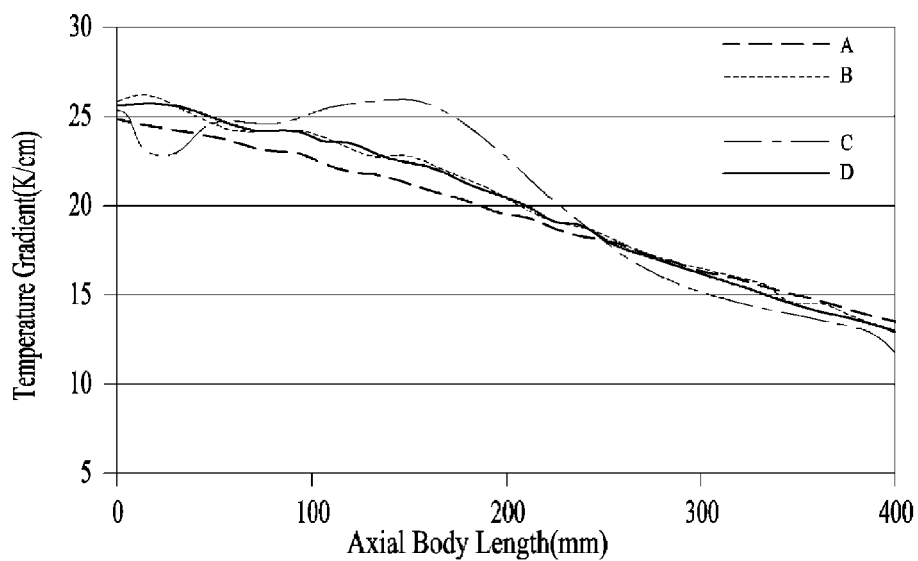

[FIG. 7]
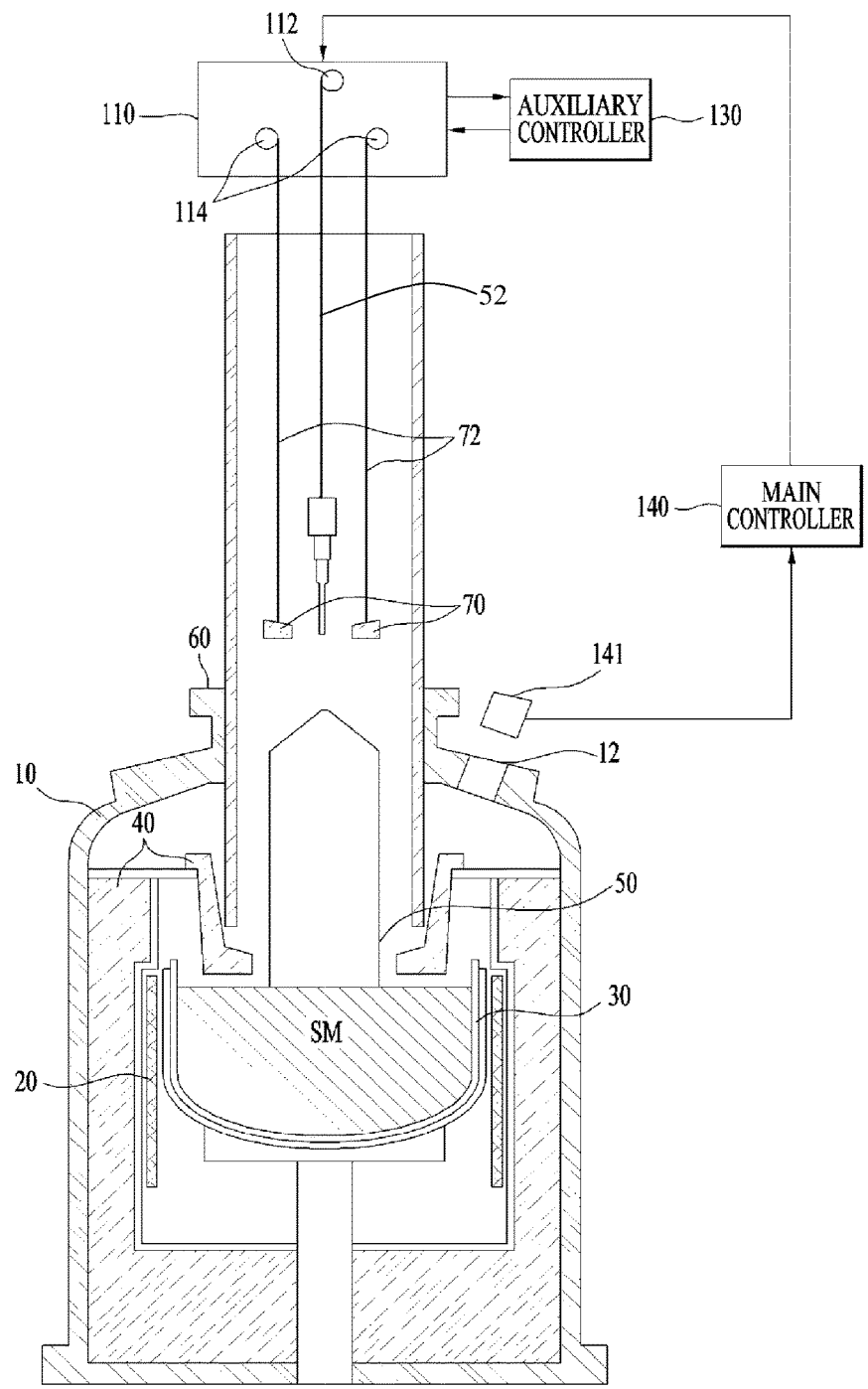

[FIG. 8]
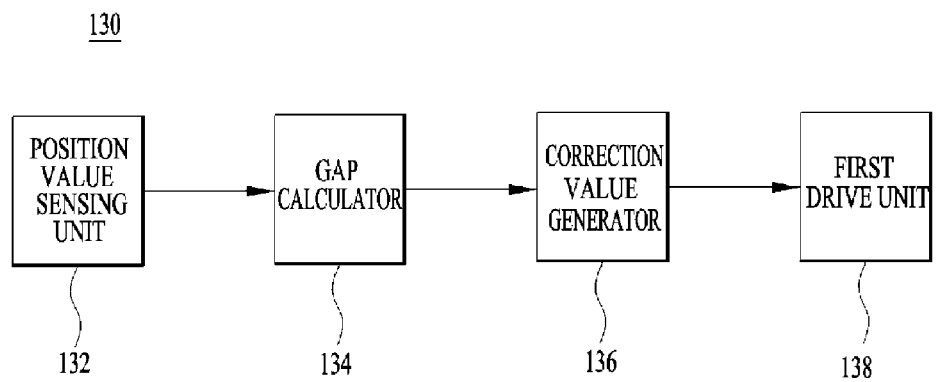
[FIG. 9]
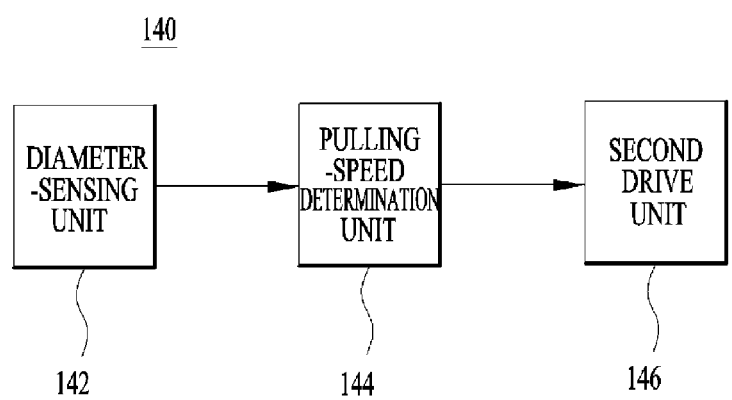

[FIG. 10]
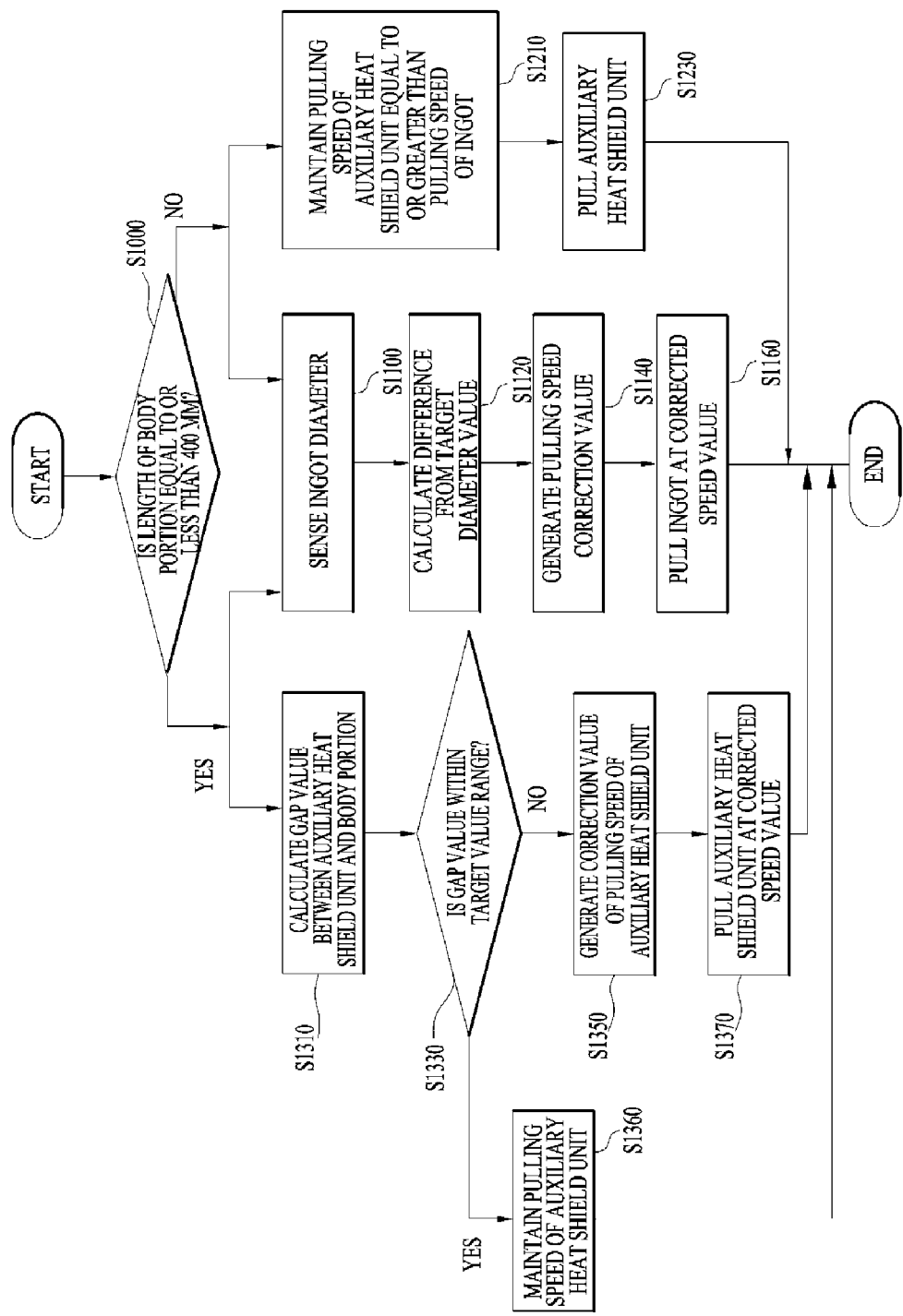

SILICON SINGLE CRYSTAL GROWING APPARATUS AND SILOCON SINGLE CRYSTAL GROWING METHOD USING SAME

CROSS-REFERENCE TO RELATED PATENT APPLICATIONS

This application is a U.S. National Stage Application under 35 U.S.C. § 371 of PCT Application No. PCT/KR2015/007169, filed Jul. 10, 2015, which claims priority to Korean Patent Application Nos. 10-2014-0100301, filed Aug. 5, 2014 and 10-2015-0001950 filed Jan. 7, 2015, whose entire disclosures are hereby incorporated by reference.

TECHNICAL FIELD

Embodiments relate to a silicon single-crystal growing apparatus for adjusting a crystal defect area in a single-crystal ingot body portion that is being grown and a silicon single-crystal growing method using the same.

BACKGROUND ART

Generally, a floating zone (FZ) method or a CZochralski (CZ) method has frequently been used as a method of manufacturing a silicon single-crystal. The growth of a silicon single-crystal ingot by an FZ method has several problems, such as difficulty in manufacturing a large-diameter silicon wafer and considerably expensive process costs. Therefore, the growth of a silicon single-crystal ingot using the CZ method is prevalent.

With the CZ method, after polycrystalline silicon is stacked into a quartz crucible and is melted by heating a graphite heating element, a seed crystal is dipped into the resulting silicon melt to cause crystallization at the interface of the silicon melt and is then pulled while being rotated, thereby completing the growth of a single-crystal silicon ingot.

The single-crystal ingot grown by the above-described method includes a neck portion, which is connected to the seed crystal and is formed in a thin and long shape, a shoulder portion, which is grown by gradually increasing the diameter of the single-crystal ingot after a necking process, a body portion, which is grown in an axial direction while maintaining the increased diameter, and a tail portion, which is formed by gradually reducing the diameter of the single-crystal ingot that is being grown and is separated from the silicon melt.

In the case of a conventional silicon single-crystal ingot growing apparatus and a single-crystal ingot growing method using the same, because the top of a crucible is open, a single-crystal ingot may exhibit uneven distribution of heat during a growth process thereof, and in addition, a difference occurs in the cooling rate between the central portion and the peripheral portion of the cross section of the single-crystal ingot.

Due to such a temperature gradient in the radial direction of the single-crystal ingot, crystal defects formed in the center area and the peripheral area of the cross section of the single-crystal ingot have different distributions at the same position in the pulling axial direction. Therefore, it is difficult to grow the single-crystal ingot by increasing a defect-free crystal area.

DISCLOSURE

Technical Problem

Embodiments are intended to provide a silicon single-crystal growing apparatus and growing method in which an auxiliary heat shield unit is disposed above a crucible and in which the pulling speed of the auxiliary heat shield unit is controlled so as to increase the distribution of a defect-free area in a single-crystal ingot body portion.

Technical Solution

One embodiment provides a silicon single-crystal growing apparatus including a chamber, a crucible placed in the chamber for accommodating a silicon melt, a heater placed outside the crucible for heating the crucible, a heat shield unit placed in the chamber, and an auxiliary heat shield unit placed above the crucible so as to be vertically movable, wherein the auxiliary heat shield unit is upwardly spaced apart from a body portion of a single-crystal ingot that is grown in the silicon melt, and a rising speed of the auxiliary heat shield unit is controlled so as to increase distribution of a defect-free area in the single-crystal ingot body portion Another embodiment provides a silicon single-crystal growing apparatus including a chamber, a crucible placed in the chamber for accommodating a silicon melt, a heater placed outside the crucible for heating the crucible, a heat shield unit placed in the chamber, an auxiliary heat shield unit placed above the crucible so as to be vertically movable, a main controller for controlling a pulling speed of a single-crystal ingot that is grown in the silicon melt, an auxiliary controller for controlling a rising speed of the auxiliary heat shield unit, and a pulling device for pulling each of the single-crystal ingot and the auxiliary heat shield unit based on a control signal input from the main controller and the auxiliary controller.

Another embodiment provides a silicon single-crystal growing method performed in a silicon single-crystal growing apparatus including a chamber, a crucible placed in the chamber for accommodating a silicon melt, a heat shield unit placed in the chamber, and an auxiliary heat shield unit placed above the crucible so as to be vertically movable, the method including controlling a rising speed of the auxiliary heat shield unit so that the auxiliary heat shield unit maintains a predetermined distance from a body portion of a single-crystal ingot that is grown in the silicon melt so as to increase distribution of a defect-free area in the single-crystal ingot body portion.

A further embodiment provides a silicon single-crystal growing method performed in a silicon single-crystal growing apparatus including a chamber, a crucible placed in the chamber for accommodating a silicon melt, a heat shield unit placed in the chamber, an auxiliary heat shield unit placed above the crucible so as to be vertically movable, a main controller for controlling a pulling speed of a single-crystal ingot that is grown in the silicon melt, an auxiliary controller for controlling a rising speed of the auxiliary heat shield unit, and a pulling device for pulling each of the single-crystal ingot and the auxiliary heat shield unit based on a control signal input from the main controller and the auxiliary controller, the method including checking a length of a body portion of the grown single-crystal ingot, and determining whether or not to operate the auxiliary heat shield unit by the auxiliary controller based on the checked length of the body portion.

Advantageous Effects

In a silicon single-crystal growing apparatus and growing method according to an embodiment, an auxiliary heat shield unit is disposed above a crucible and the pulling speed of the auxiliary heat shield unit is controlled, whereby a defect area in a single-crystal ingot body portion may be controlled and the distribution of a defect-free area may be increased.

DESCRIPTION OF DRAWINGS

FIG. 1 is a view illustrating one embodiment of a silicon single-crystal growing apparatus, FIGS. 2a and 2b are views illustrating one embodiment of an auxiliary heat shield unit, FIG. 3 is a view illustrating a portion of the silicon single-crystal growing apparatus of one embodiment, FIGS. 4a and 4b are views illustrating the distribution of crystal defects in a body portion of a single-crystal ingot, FIG. 5 is a view illustrating the distribution of temperature in the cross section of the single-crystal ingot, FIG. 6 is a view illustrating a difference in cooling rate in the cross section of the single-crystal ingot, FIG. 7 is a view illustrating one embodiment of a silicon single-crystal growing apparatus, FIG. 8 is a block diagram illustrating one embodiment of an auxiliary controller, FIG. 9 is a block diagram illustrating one embodiment of a main controller, and FIG. 10 is a flowchart illustrating one embodiment of a silicon single-crystal growing method.

BEST MODE

Hereinafter, embodiments will be described in detail with reference to the accompanying drawings in the best manner to concretely describe the present invention and to improve understanding of the present invention. However, various modifications of the embodiments of the present invention are possible, and the technical sprit of the present invention should not be constructed as being limited to the embodiments described below. The embodiments of the present invention are provided to more completely explain the present invention to those skilled in the art.

It will be understood that, when an element is referred to as being formed "on" or "under" another element, it can be directly "on" or "under" the other element or be indirectly formed with intervening elements therebetween. It will also be understood that "on" or "under" the element may be described relative to the drawings.

In the drawings, the thickness or size of each layer may be exaggerated, omitted or schematically illustrated for clarity and convenience. In addition, the size of each constituent element does not wholly reflect an actual size thereof.

FIG. 1 is a view illustrating one embodiment of a silicon single-crystal growing apparatus.

The silicon single-crystal growing apparatus of the embodiment illustrated in FIG. 1 may include a chamber 10, a crucible 30 for accommodating a silicon melt, and a heater 20 and a heat shield unit 40, which are disposed outside the crucible.

The chamber 10 may take the form of a cylinder having a cavity formed therein, and a pulling chamber (not illustrated) may be connected to and disposed above the chamber 10.

The crucible 30 for accommodating the silicon melt SM may be disposed inside the chamber 10. The crucible 30 may be disposed in the central area of the chamber 10, and the entire crucible may have a concave container shape. In addition, the crucible 30 may be comprised of a quartz crucible, which comes into direct contact with the silicon melt SM, and a graphite crucible, which surrounds the outer surface of the quartz crucible and supports the quartz crucible.

The heater 20 may be disposed around the crucible 30 to supply heat toward the crucible 30. The heater 20 may be spaced apart from the outer circumferential surface of the crucible 30 by a predetermined distance to thereby be disposed outside the crucible 30, and may be disposed in a cylindrical form so as to surround the side portion of the crucible 30. In addition, a water-cooling pipe 60 may be provided above the chamber 10 to cool a grown single-crystal ingot 50.

The heat shield unit 40 may be disposed in the chamber 10 of the single-crystal growing apparatus in order to preserve the heat of the crucible 30, which is heated by the heater 20. The heat shield unit 40 may be included between the heater 20 and the chamber 10. Although the heat shield unit 40 may include an upper heat shield unit disposed above the crucible 30, a side heat shield unit disposed around the side surface of the crucible 30, and a lower heat shield unit disposed below the crucible 30, the arrangement of the heat shield unit 40 is not limited thereto.

The heat shield unit 40 may be formed using a material and shape that achieve optimum thermal distribution in the heater 20 and the crucible 30 and enable the maximum utilization of thermal energy without loss.

The single-crystal growing apparatus of the embodiment illustrated in FIG. 1 may include an auxiliary heat shield unit 70.

The auxiliary heat shield unit 70 may be disposed above the crucible and may be vertically movable.

FIGS. 2a and 2b are views illustrating one embodiment of the auxiliary heat shield unit.

Referring to FIGS. 2a and 2b, an auxiliary heat shield unit 70A or 70B may have a cylindrical side surface with open upper and lower surfaces in order to surround a seed chuck, and may be empty inside the side surface thereof.

The auxiliary heat shield unit 70A or 70B may have a disc shape, as illustrated in FIG. 2a, or may have a truncated conical shape, as illustrated in FIG. 2b, without being limited thereto. The auxiliary heat shield unit 70A or 70B may be formed of graphite or carbon composite material (CCM).

The lower surface of the auxiliary heat shield unit 70A or 70B may be flat so as to maintain a predetermined distance from a body portion of the single-crystal ingot.

A wire 72 may be attached to the top of the auxiliary heat shield unit 70A or 70B to adjust the vertical movement of the auxiliary heat shield unit 70A or 70B. At this time, the wire 72 may be a first wire 72 in an embodiment of the silicon single-crystal growing apparatus that will be described below. In addition, although only two wires 72 are illustrated as being connected to the auxiliary heat shield unit in the drawings, the embodiment is not limited thereto. Three or more wires may be connected to the auxiliary heat shield unit so as to adjust the movement of the auxiliary heat shield unit.

FIG. 3 is a view illustrating a portion of the single-crystal growing apparatus of one embodiment.

Referring to FIG. 3, the auxiliary heat shield unit 70 may be disposed above the accommodated silicon melt SM. For example, the auxiliary heat shield unit 70 may be upwardly spaced apart from the silicon single-crystal ingot 50 that is being grown from the silicon melt SM.

In addition, the rising speed of the auxiliary heat shield unit 70 may be controlled so that the auxiliary heat shield unit 70 maintains a predetermined distance from a body portion B of the single-crystal ingot 50 so as to increase the distribution of a defect-free area in the body portion B of the single-crystal ingot that is being grown.

At this time, the predetermined distance between the auxiliary heat shield unit 70 and the single-crystal ingot body portion B may be controlled so as to vary correspondingly based on the conditions of a growth process for the manufacture of the single-crystal ingot.

That is, a gap between the auxiliary heat shield unit 70 and the single-crystal ingot body portion B may be adjusted based on, for example, the pulling speed of the single-crystal ingot, the temperature of the silicon melt in the crucible, or the temperature inside the chamber in the single-crystal growth process.

The auxiliary heat shield unit 70 may be disposed at a predetermined distance d from the boundary of a shoulder portion S and the body portion B of the single-crystal ingot 50 that is being grown.

For example, the auxiliary heat shield unit 70 may be disposed above the body portion B, and the rising speed of the auxiliary heat shield unit 70 may be controlled so that the distance d between the auxiliary heat shield unit 70 and the boundary of the shoulder portion S and the body portion B of the ingot, which is the beginning point of the body portion B, is maintained within a range from 150 mm to 300 mm.

In order to maintain the predetermined distance between the auxiliary heat shield unit 70 and the body portion B, the rising speed of the auxiliary heat shield unit 70 may range from 0.5 mm/min to 0.7 mm/min. When the auxiliary heat shield unit 70 is moved upward at a speed higher than 0.7 mm/min, the distance d between the single-crystal ingot 50 that is being grown and the auxiliary heat shield unit 70 may be increased, and therefore, the magnitude of a temperature gradient between the center and the periphery of the single-crystal ingot 50 may not be reduced by the desired value. When the auxiliary heat shield unit 70 is moved at a speed lower than 0.5 mm/min, contact between the auxiliary heat shield unit 70 and the single-crystal ingot 50 that is being grown may occur.

The rising speed of the auxiliary heat shield unit 70 may be the same as the pulling speed of the single-crystal ingot 50 that is being grown.

That is, in the single-crystal growth process, while the shoulder portion S and the beginning portion of the body portion B are grown, the rising speed of the auxiliary heat shield unit 70 and the pulling speed of the single-crystal ingot 50 may be the same so as to maintain the predetermined distance between the auxiliary heat shield unit 70 and the body portion B of the single-crystal ingot 50. Thereby, the cooling rate of the body portion of the single-crystal ingot that is being grown may be adjusted, which may increase the distribution of a defect-free area in crystals formed in the beginning portion of the body portion B.

FIGS. 4a and 4b are views illustrating the distribution of a crystal defect area in the body portion B depending on whether or not the auxiliary heat shield unit 70 is applied.

In the drawings, the X-axis represents the axial length of the single-crystal ingot body portion. The beginning point of the body portion B, i.e. the boundary point of the shoulder portion S and the body portion B, is 0 mm, and the length of the single-crystal ingot that is being grown increases in the axial direction.

In the drawings, the Y-axis represents the pulling speed of the single-crystal ingot, and the solid line indicates variation in pulling speed depending on the length of the single-crystal ingot body portion.

In addition, the Y-axis direction may correspond to the radial direction at one position in the longitudinal direction in which the body portion is grown. For example, the center of the Y-axis area illustrated in the graph may correspond to the center portion of the cross section of the single-crystal ingot, and on the basis of the center, the direction in which the Y-axis value increases and the direction in which the Y-axis value decreases may correspond to the peripheral area of the cross section of the single-crystal ingot.

In the drawings, the dotted line represents the border of a crystal defect area. The area designated by 1) represents an octahedral void area, which is a defective area generated during baking, the area designated by 2) represents an oxidation-induced stacking fault (OiSF) area, and the area designated by 3) represents a defect-free area.

FIG. 4a illustrates the distribution of crystal defects in the single-crystal ingot body portion when the auxiliary heat shield unit 70 is not applied.

Referring to the illustration of FIG. 4a, it can be found that, in the case where the auxiliary heat shield unit is not provided, a defective area included in the single-crystal ingot is distributed to the position at which the length of the body portion is 350 mm, and it can also be found that an area in which the same kind of defects are arranged and an area in which all of an octahedral void defect, an OiSF defect, and a defect-free area are included appear in the radial direction of the body portion.

Compared to FIG. 4a, in FIG. 4b illustrating the distribution of crystal defects in the case where the auxiliary heat shield unit 70 is applied, it can be found that only a defect-free area is distributed when the length of the body portion becomes longer than 200 mm, and crystal defects having the same shape appear in the radial direction of the body portion when the length of the body portion is equal to or less than 200 mm.

That is, when the single-crystal growth process is performed in the state in which the auxiliary heat shield unit 70 is disposed above the silicon melt SM to maintain the predetermined distance from the single-crystal ingot, the auxiliary heat shield unit 70 may prevent heat from being lost from the top of the silicon melt SM accommodated in the crucible, thereby preventing rapid cooling of the shoulder portion S and the beginning portion of the body portion B while the growth of the single-crystal ingot progresses, which may reduce a crystal defect area attributable to the rapid cooling.

In the single-crystal growing apparatus of the embodiment, the rising speed of the auxiliary heat shield unit 70 may be controlled to reduce the difference in temperature between the center and the periphery of the cross section of the body portion, which is perpendicular to the rising direction of the auxiliary heat shield unit 70.

FIG. 5 is a graph illustrating the distribution of temperature K in the single-crystal ingot body portion depending on whether or not the auxiliary heat shield unit 70 is applied. In the graph of FIG. 5, "A" and "B" represent results regarding the peripheral area of the cross section of the single-crystal ingot body portion. "A" corresponds to the case where no auxiliary heat shield unit is provided, and "B" corresponds to the case where the auxiliary heat shield unit is provided.

In addition, "C" and "D" represent results regarding the center area of the cross section of the body portion. "C" corresponds to the case where no auxiliary heat shield unit is provided, and "D" corresponds to the case where the auxiliary heat shield unit is provided.

Referring to FIG. 5, in the case of a single-crystal ingot that is grown by a single-crystal growing apparatus not including the auxiliary heat shield unit 70, a difference in temperature between the center C and the periphery A of the body portion is increased as the length of the body portion is increased.

On the other hand, in the case of the single-crystal ingot that is grown by the single-crystal growing apparatus of the embodiment in which the auxiliary heat shield unit 70 is included and the movement speed of the auxiliary heat shield unit is controlled to maintain the predetermined distance between the auxiliary heat shield unit and the body portion, it can be found that there is almost no apparent difference in temperature between the center D and the periphery B of the body portion even though the body portion is grown until the length thereof becomes 400 mm.

Accordingly, in the single-crystal growing apparatus of the embodiment, the auxiliary heat shield unit 70 is provided and the rising speed thereof is controlled, whereby a difference in the temperature of the cross section of the body portion section may be reduced during the single-crystal growth process, which may result in uniform distribution of crystal defects.

In the single-crystal growing apparatus of the embodiment, the rising speed of the auxiliary heat shield unit 70 may be controlled to reduce the difference in cooling rate between the center and the periphery of the cross section of the body portion, which is perpendicular to the rising direction of the auxiliary heat shield unit.

FIG. 6 is a graph illustrating the temperature gradient (K/cm) in the single-crystal ingot body portion depending on whether or not the auxiliary heat shield unit 70 is applied.

In FIG. 6, the temperature gradient may be a difference in cooling rate. In addition, in the same manner as FIG. 5, "A" and "C" respectively represent the peripheral area and the center of the cross section of the single-crystal ingot when the auxiliary heat shield unit is not provided, and "B" and "D" respectively represent the peripheral area and the center of the cross section of the single-crystal ingot in the case of using the single-crystal growing apparatus of the embodiment in which the auxiliary heat shield unit is provided so as to control the movement speed thereof.

Referring to FIG. 6, it can be found that there is a difference in the cooling rate between the center C and the peripheral area A of the single-crystal ingot body portion in the case where the auxiliary heat shield unit 70 is not applied, and that the difference in cooling rate, i.e. the temperature gradient in the area in which the length of the body portion ranges from 100 mm to 200 mm is equal to or greater than 5 K/cm.

Compared to the above description, in the case where the single-crystal growing apparatus of the embodiment including the auxiliary heat shield unit 70 is used, it can be found that there is almost no difference in cooling rate between the center D and the peripheral area B of the body portion.

Accordingly, the single-crystal growing apparatus of the embodiment may control the rising speed of the auxiliary heat shield unit so that the auxiliary heat shield unit is a predetermined distance from the single-crystal ingot body portion, thereby reducing the difference in cooling rate between the center and the periphery of the cross section of the body portion, which is perpendicular to the rising direction of the auxiliary heat shield unit. In this way, the single-crystal growing apparatus of the embodiment may adjust a crystal defect area and may increase the distribution of a defect-free area in the body portion.

For example, in the embodiment, the difference in cooling rate between the center D and the periphery B of the cross section of the body portion may be below 1 K/cm.

FIG. 7 is a view illustrating one embodiment of a silicon single-crystal growing apparatus.

With regard to the embodiment of the single-crystal growing apparatus described below with reference to the drawings, a repeated description of the above-described embodiment of the single-crystal growing apparatus is omitted, and only differences will be described below.

The silicon single-crystal growing apparatus of the embodiment illustrated in FIG. 7 may include the chamber 10, the crucible 30 for accommodating a silicon melt, the heater 20 and the heat shield unit 40 disposed outside the crucible, a main controller 140 for controlling the pulling speed of the single-crystal ingot, and an auxiliary controller 130 for controlling the rising speed of the auxiliary heat shield unit.

In addition, the silicon single-crystal growing apparatus of the embodiment may include the water-cooling pipe 60, which extends from the upper side of the crucible 30 in the pulling direction of the single-crystal ingot, and a pulling device 110 connected to the single-crystal ingot and the auxiliary heat shield unit via wires 72 and 52.

The pulling device 110 may include a first pulling unit 114, which is connected to the upper surface of the auxiliary heat shield unit 70 via a first wire 72, and a second pulling unit 112, which is connected to the silicon single-crystal ingot that is being grown, via a second wire 52.

The first pulling unit 114 may be connected to the auxiliary heat shield unit 70 so as to upwardly move the auxiliary heat shield unit upward from the crucible. At least one first pulling unit 114 may be provided, or a plurality of first pulling units 114 may be provided to enable balanced rising of the auxiliary heat shield unit 70. In addition, a plurality of first wires 72 may be provided to interconnect the auxiliary heat shield unit 70 and the first pulling unit 114.

The second pulling unit 112 may serve to upwardly move the single-crystal ingot that is being grown from the crucible. The second pulling unit may be connected to a single-crystal seed portion, at which the growth of the single-crystal ingot begins, via the second wire 52. In addition, the second pulling unit 112 may be connected to a seed chuck, which is connected to the upper end of the single-crystal ingot, via the wire 52.

The auxiliary controller 130 may receive positional information about the position of the auxiliary heat shield unit and the grown single-crystal ingot body portion, which is output from the pulling device 110, and may also feedback a correction value, calculated in the auxiliary controller 130, to the pulling device 110. At this time, the feedback value may be transmitted to the second pulling unit 114 of the pulling device 110, which is the pulling device for the auxiliary heat shield unit.

FIG. 8 is a block diagram illustrating a configuration of the auxiliary controller 130 in brief.

Referring to FIG. 8, the auxiliary controller 130 may include a position value sensing unit 132, a gap calculator 134, a correction value generator 136, and a first drive unit 138.

The position value sensing unit 132 may acquire a position value of the body portion of the grown single-crystal ingot and a position value of the auxiliary heat shield unit, which are checked in the pulling device.

For example, the position value of the single-crystal ingot body portion may be the value of the position at which the body portion of the grown single-crystal ingot begins, and the position value of the auxiliary heat shield unit may be the value of the position of the lower surface of the auxiliary heat shield unit.

The gap calculator 134 may extract a gap between the body portion and the auxiliary heat shield unit from the position values of the body portion and the auxiliary heat shield unit acquired by the position value sensing unit 132.

For example, referring again to FIG. 3, the gap between the body portion and the auxiliary heat shield unit may be the distance d between the lower surface of the auxiliary heat shield unit and the beginning portion of the body portion.

At this time, the beginning portion of the body portion may correspond to the boundary of the shoulder portion S and the body portion B.

The correction value generator 136 may extract a correction value of the rising speed of the auxiliary heat shield unit based on the distance between the body portion and the auxiliary heat shield unit calculated in the gap calculator 134.

At this time, a target gap value between the body portion and the auxiliary heat shield unit may be set, and the correction value of the rising speed may be extracted via comparison between the calculated gap value and the set target gap value.

For example, when the gap value between the body portion and the auxiliary heat shield unit is within a target value range, a rising speed value of the auxiliary heat shield unit, on which the correction value has been reflected, may be equal to a current rising speed value. In addition, when the calculated gap value is greater than the target value, the corrected rising speed may be less than the current rising speed. When the calculated gap value is less than the target value, the corrected rising speed may be greater than the current rising speed.

That is, the rising speed value of the auxiliary heat shield unit may be adjusted so that the gap value between the body portion and the auxiliary heat shield unit coincides with the target value range.

At this time, the target value may range from 150 mm to 300 mm.

The auxiliary controller 130 may include the first drive unit 138.

The first drive unit 138 may output a signal that causes the auxiliary heat shield unit to be pulled via the pulling device 110. The first drive unit 138 may transmit data regarding the corrected rising speed value, generated in the correction value generator 136, to the pulling device 110.

The first drive unit 138 may be a servo motor for operating the auxiliary heat shield unit while controlling the rising speed thereof.

That is, the auxiliary heat shield unit 70, which is moved upward under the control of the auxiliary controller 130, may be controlled so as to maintain the predetermined distance d from the boundary of the shoulder portion S and the body portion B of the single-crystal ingot 50 that is being grown.

At this time, the predetermined distance between the auxiliary heat shield unit 70 and the single-crystal ingot body portion B may be controlled so as to vary based on the conditions of the growth process for manufacturing the single-crystal ingot.

That is, the distance between the auxiliary heat shield unit 70 and the single-crystal ingot body portion B may be adjusted based on, for example, the pulling speed of the single-crystal ingot, the temperature of the silicon melt in the crucible, or the temperature inside the chamber in the single-crystal growth process.

For example, the auxiliary heat shield unit 70 may be disposed above the body portion B, and the speed of the auxiliary heat shield unit 70 may be controlled so that the distance d between the auxiliary heat shield unit and the boundary of the shoulder portion S and the body portion B of the silicon single-crystal ingot, which is the beginning point of the body portion B, is maintained within a range from 150 mm to 300 mm.

Referring again to FIG. 7, the main controller 140 may transmit a signal, acquired from a sensor 141, which is located at one side above the chamber, to the pulling device 110 so as to adjust the pulling speed of the single-crystal ingot.

In FIG. 7, the sensor 141 may sense the extent of growth of the single-crystal ingot via a view port 12, which is formed in one side of the top of the chamber.

The sensor 141 may be any of various sensors for measuring the diameter of the single-crystal ingot that is being grown, such as, for example, an infrared sensor, a CCD camera, or a pyrometer. For example, the sensor 141 may be an automatic diameter control (ADC) sensor.

Information sensed via the sensor 141 may be optical information or image information, from which variation in the diameter of the silicon single-crystal ingot may be estimated.

The information regarding variation in the diameter of the single-crystal ingot that is being grown, sensed by the sensor, may be transmitted to the main controller 140.

FIG. 9 is a block diagram illustrating a configuration of the main controller 140 in brief.

Referring to FIG. 9, the main controller 140 may include a diameter-sensing unit 142, a pulling-speed determination unit 144, and a second drive unit 146.

The diameter-sensing unit 142 may extract a diameter value of the silicon single-crystal ingot from the information sensed and transmitted by the above-described sensor 141.

The diameter-sensing unit 142 may successively acquire variation in the diameter of the silicon single-crystal ingot depending on the progress of the process.

The diameter value of the silicon single-crystal ingot acquired from the diameter-sensing unit 142 may be transmitted to the pulling-speed determination unit 144.

The pulling-speed determination unit 144 may determine the pulling speed of the single-crystal ingot based on the diameter value of the single-crystal ingot, which is input from the diameter-sensing unit 142.

For example, the pulling-speed determination unit 144 may judge whether or not to adjust the pulling speed of the single-crystal ingot from data regarding the diameter of the silicon single-crystal ingot that is being grown, input from the diameter-sensing unit 142, and may change the pulling speed using PID control.

That is, when there is a difference between the measured diameter value from the diameter-sensing unit 142 and a target diameter value as a result of comparing the measured diameter value with the target diameter value, a pulling speed value of the single-crystal ingot may be adjusted.

For example, when the measured diameter value is greater than the target diameter value, the pulling speed may be adjusted so as to be greater than a current pulling speed. In addition, when the measured diameter value is less than the target diameter value, the pulling speed may be adjusted so as to be less than the current pulling speed.

The main controller 140 may include the second drive unit 146.

The second drive unit 146 may output a signal that causes the silicon single-crystal ingot to be pulled via the pulling device 110. The second drive unit 146 may transmit data regarding a corrected pulling speed value, generated in the pulling-speed determination unit 144, to the pulling device 110.

The second drive unit 146 may be a servo motor for operating the second pulling unit 112 by controlling the pulling speed of the single-crystal ingot that is being grown.

Accordingly, the single-crystal growing apparatus of the embodiment illustrated in FIGS. 7 to 9 may include the auxiliary controller for controlling the auxiliary heat shield unit and the main controller for controlling the pulling of the silicon single-crystal ingot, whereby the rising speed of the auxiliary heat shield unit may be controlled so that the auxiliary heat shield unit is located at a predetermined distance from the single-crystal ingot body portion that is being grown.

In addition, when the auxiliary heat shield unit is controlled to maintain a predetermined distance from the silicon single-crystal ingot body portion, by reducing a difference in cooling rate between the center and the periphery of the cross section of the body portion, which is perpendicular to the rising direction of the auxiliary heat shield unit, a crystal defect area may be adjusted and the distribution of a defect-free area in the body portion may be increased.

Hereinafter, embodiments of a silicon single-crystal growing method using the silicon single-crystal growing apparatus of the above-described embodiments will be described below.

In the following description of the embodiments, a repeated description of the above-described embodiments of the silicon single-crystal growing apparatus will be omitted, and differences will be described below.

A silicon single-crystal growing method according to one embodiment may be performed in a silicon single-crystal growing apparatus including a chamber, a crucible disposed in the chamber for accommodating a silicon melt, a heat shield unit placed in the chamber, and an auxiliary heat shield unit placed above the crucible so as to be vertically movable. The silicon single-crystal growing method may include the step of controlling the rising speed of the auxiliary heat shield unit so that the auxiliary heat shield unit maintains a predetermined distance from a body portion of a single-crystal ingot that is being grown in the silicon melt so as to increase the distribution of a defect-free area in the single-crystal ingot body portion.

In the single-crystal growth process of the embodiment, the rising speed of the auxiliary heat shield unit may be controlled so as to reduce a difference in temperature between the center and the periphery of the cross section of the body portion, which is perpendicular to the rising direction of the auxiliary heat shield unit.

In addition, the rising speed of the auxiliary heat shield unit may be controlled so as to reduce a difference in cooling rate between the center and the periphery of the cross section of the body portion, and the difference in cooling rate may be controlled so as to be, for example, below 1 K/cm.

That is, in the embodiment, the rising speed of the auxiliary heat shield unit disposed above the crucible may be controlled to prevent the loss of heat from the silicon melt during the growth of the single-crystal ingot body portion and to prevent rapid cooling of the single-crystal ingot, thereby reducing a difference in temperature between the center and the periphery of the cross section of the single-crystal ingot and the magnitude of a temperature gradient in the axial direction.

Accordingly, with a reduction in the magnitude of the temperature gradient, the distribution of a defect area in the radial direction of the single-crystal ingot may become uniform. In addition, through adjustment of the temperature gradient, a defect-free area may be formed starting from the beginning portion of the body portion, which may increase the distribution of the defect-free area in the body portion.

The rising speed of the auxiliary heat shield unit may be controlled so that the auxiliary heat shield unit is upwardly spaced apart from the boundary of the shoulder portion and the body portion of the single-crystal ingot by a distance ranging from 150 mm to 300 mm.

In addition, the rising speed of the auxiliary heat shield unit may be controlled in the case where the length of the body portion is equal to or less than 400 mm.

When the body portion is grown to be longer than 400 mm, the growth of crystals in the body portion is more greatly affected by the water-cooling pipe, which is disposed in the upper region of the chamber, than by the insulation effect of the auxiliary heat shield unit. Therefore, the control of the crystal defect area of the single-crystal ingot using the auxiliary heat shield unit may be more effective when the auxiliary heat shield unit is located between the surface of the silicon melt and the water-cooling pipe.

That is, once the auxiliary heat shield unit has passed through the water-cooling pipe, the effect of adjusting the crystal defect area in the single-crystal ingot by controlling the rising speed of the auxiliary heat shield unit may be reduced.

A silicon single-crystal growing method according to another embodiment may be performed in a silicon single-crystal growing apparatus including a chamber, a crucible disposed in the chamber for accommodating a silicon melt, a heat shield unit placed in the chamber, an auxiliary heat shield unit placed above the crucible so as to be vertically movable, a main controller for controlling the pulling speed of the single-crystal ingot that is grown in the silicon melt, and an auxiliary controller for controlling the rising speed of the auxiliary heat shield unit. The silicon single-crystal growing method may include the steps of checking the length of a body portion of the grown single-crystal ingot, and determining whether or not to operate the auxiliary heat shield unit by the auxiliary controller based on the checked length of the body portion.

FIG. 10 is a flowchart illustrating one embodiment of the silicon single-crystal growing method.

For example, the flowchart of the silicon single-crystal growing method illustrated in FIG. 10 may represent the step of controlling the rising speed of the auxiliary heat shield unit and the pulling speed of the single crystal ingot by the main controller and the auxiliary controller.

Referring to FIG. 10, the silicon single-crystal growing method of the embodiment may include the step S1000 of checking the length of the grown single-crystal ingot body portion and judging whether or not the checked length of the body portion is equal to or less than 400 mm.

When the length of the body portion is equal to or less than 400 mm, in the silicon single-crystal growing method, the pulling of the single-crystal ingot may be controlled by the main controller, and the operation of the auxiliary heat shield unit may be controlled by the auxiliary controller.

At this time, the step of controlling the operation of the auxiliary heat shield unit by the auxiliary controller may include the step of checking the position of the body portion and the position of the auxiliary heat shield unit, the step S1310 of calculating a gap value between the body portion and the auxiliary heat shield unit based on the checked positions, the step S1330 of judging whether or not the calculated gap value is within a target gap value range, the step S1350 of generating a correction value of the rising speed of the auxiliary heat shield unit when the gap value deviates from the target gap value range, and the step S1370 of pulling the auxiliary heat shield unit based on the generated rising speed correction value.

At this time, the target gap value between the body portion and the auxiliary heat shield unit may range from 150 mm to 300 mm. That is, a gap between the boundary of the shoulder portion and the body portion of the single-crystal ingot that is being grown and the lower surface of the auxiliary heat shield unit may be continuously maintained within the target gap value range from 150 mm to 300 mm.

In addition, the step of controlling the operation of the auxiliary heat shield unit by the auxiliary controller may include the step S1360 of upwardly moving the auxiliary heat shield unit without variation in current rising speed when the gap between the body portion and the auxiliary heat shield unit is within the target gap value range.

Meanwhile, in the step S10000 of checking the length of the body portion of the grown single-crystal ingot and judging whether or not the checked length of the body portion is equal to or less than 400 mm, when the measured length of the body portion is greater than 400 mm, the rising speed of the auxiliary heat shield unit may be maintained equal to or greater than the pulling speed of the single-crystal ingot.

That is, the operation of the auxiliary heat shield unit may include the step S1210 of maintaining the rising speed of the auxiliary heat shield unit so as to be equal to or greater than the pulling speed of the silicon single-crystal ingot.

For example, in the process after the silicon single-crystal ingot is grown so that the length of the body portion is equal to or greater than 400 mm, the rising speed of the auxiliary heat shield unit may be maintained equal to or greater than the pulling speed of the silicon single-crystal ingot regardless of the gap between the auxiliary heat shield unit and the body portion.

In the embodiment of the silicon single-crystal growing method illustrated in FIG. 10, the pulling speed of the single-crystal ingot may be controlled by the main controller.

The step of controlling the pulling speed of the single-crystal ingot by the main controller includes the step S1100 of sensing the diameter of the single-crystal ingot using a diameter-sensing unit, the step S1120 of calculating an error between a sensed diameter value and a target diameter value by the pulling-speed determination unit, the step S1140 of generating a correction value of the pulling speed based on the calculated error, and the step S1160 of pulling the single-crystal ingot at a changed pulling speed depending on the correction value.

Accordingly, the silicon single-crystal growing method of the embodiment illustrated in FIG. 10 may extract the gap value between the body portion of the single-crystal ingot and the auxiliary heat shield unit, and may control the rising speed of the auxiliary heat shield unit and the pulling speed of the silicon single-crystal ingot based on the extracted gap value.

In addition, when the auxiliary controller controls the auxiliary heat shield unit so as to be maintained at a predetermined distance from the single-crystal ingot, by reducing a difference in cooling rate between the center and the periphery of the cross section of the body portion, which is perpendicular to the rising direction of the auxiliary heat shield unit, a crystal defect area may be adjusted, and the distribution of a defect-free area in the body portion may be increased.

In the case of the single-crystal growing apparatus and growing method of the above-described embodiments, the provision of the auxiliary heat shield unit may realize an insulation effect during the initial growth of the body portion of the single-crystal ingot. In addition, the loss of heat from the top of the crucible may be minimized during the initial growth of the body portion, and the magnitude of a temperature gradient between the center and the periphery of the body portion in the axial direction and the radial direction may be reduced, whereby a crystal defect area may be uniformly adjusted and the distribution of a defect-free area may be increased.

Although the exemplary embodiments have been illustrated and described as above, it will of course be apparent to those skilled in the art that the embodiments are provided to assist understanding and the embodiments are not limited to the above description, and various modifications and variations can be made in the embodiments without departing from the spirit or scope of the disclosure, and the modifications and variations should not be understood individually from the viewpoint or scope of the disclosure so long as they include the constituent elements set forth in the claims.

INDUSTRIAL APPLICABILITY

A silicon single-crystal growing apparatus and growing method according to the embodiments may control a defect area in the body portion of a single-crystal ingot and may increase the distribution of a defect-free area, as a result of disposing an auxiliary heat shield unit above a crucible and controlling the rising speed of the auxiliary heat shield unit, thus having industrial applicability.

The invention claimed is:
1. A silicon single-crystal growing apparatus comprising:
a chamber;
a crucible placed in the chamber for accommodating a silicon melt;
a heater placed outside the crucible for heating the crucible;
a heat shield unit placed in the chamber;
an auxiliary heat shield unit placed above the crucible so as to be vertically movable;
a main controller for controlling a pulling speed of a single-crystal ingot that is grown in the silicon melt;
an auxiliary controller for controlling a rising speed of the auxiliary heat shield unit; and
a pulling device for pulling each of the single-crystal ingot and the auxiliary heat shield unit based on a control signal input from the main controller and the auxiliary controller,
wherein the auxiliary heat shield unit has a truncated conical shape,
wherein the single-crystal ingot includes a shoulder portion and a body portion, and
wherein the auxiliary heat shield unit is provided above a boundary of the shoulder portion and the body portion of the single-crystal ingot by a predetermined distance.
2. The apparatus according to claim 1, wherein the auxiliary controller includes:

a position value sensing unit for detecting a position of a body portion of the single-crystal ingot and a position of the auxiliary heat shield unit;

a gap calculator for calculating a distance between the body portion and the auxiliary heat shield unit based on the positions of the body portion and the auxiliary heat shield unit detected by the position value sensing unit;

a correction value generator for generating a correction value of the rising speed of the auxiliary heat shield unit based on a value output from the gap calculator; and a first drive unit for outputting a changed rising speed value based on the generated correction value to transmit the output value to the pulling device.

3. The apparatus according to claim 2, wherein the correction value generator generates the correction value so as to allow the auxiliary heat shield unit to maintain a predetermined distance from the body portion of the single-crystal ingot.

4. The apparatus according to claim 2, wherein the main controller includes:

a diameter-sensing unit for detecting a diameter of the single-crystal ingot;

a pulling-speed determination unit for determining the pulling speed of the single-crystal ingot based on a diameter value detected by the diameter-sensing unit; and a second drive unit for outputting a determined pulling speed value to transmit the output value to the pulling device.

5. The apparatus according to claim 1, wherein the pulling device includes:

a first pulling unit connected to an upper surface of the auxiliary heat shield unit via a first wire; and a second pulling unit connected to the single-crystal ingot via a second wire.

6. A silicon single-crystal growing method performed in a silicon single-crystal growing apparatus including a chamber, a crucible placed in the chamber for accommodating a silicon melt, a heat shield unit placed in the chamber, and an auxiliary heat shield unit placed above the crucible so as to be vertically movable, the method comprising: controlling a rising speed of the auxiliary heat shield unit so that the auxiliary heat shield unit maintains a predetermined distance from a body portion of a single-crystal ingot that is grown in the silicon melt so as to increase distribution of a defect-free area in the single-crystal ingot body portion, wherein the auxiliary heat shield unit has a truncated conical shape, and wherein the rising speed of the auxiliary heat shield unit is controlled so that the auxiliary heat shield unit is upwardly spaced apart from a boundary of a shoulder portion and the body portion of the single-crystal ingot by a distance ranging from 150 mm to 300 mm.

7. The method according to claim 6, wherein the rising speed of the auxiliary heat shield unit is controlled so as to reduce a difference in temperature between a center and a periphery of a cross section of the body portion, which is perpendicular to a rising direction of the auxiliary heat shield unit.

8. The method according to claim 6, wherein the rising speed of the auxiliary heat shield unit is controlled so as to reduce a difference in cooling rate between a center and a periphery of a cross section of the body portion, which is perpendicular to a rising direction of the auxiliary heat shield unit.

9. The apparatus according to claim 1, wherein the auxiliary heat shield unit is formed of graphite or carbon composite material.

10. The method according to claim 6, wherein the auxiliary heat shield unit is formed of graphite or carbon composite material.

* * * * *